US009477788B2

(12) United States Patent
Halder et al.

(10) Patent No.: US 9,477,788 B2
(45) Date of Patent: Oct. 25, 2016

(54) MONOLITH GEOMETRY DESIGN FOR CARBON DIOXIDE CAPTURE

(71) Applicant: Corning Incorporated, Corning, NY (US)

(72) Inventors: Amit Halder, Ithaca, NY (US); Ameya Joshi, Horseheads, NY (US); Victoria Igorevna Kosheleva, St. Petersburg (RU); Denis Pavlovich LUkanin, St. Petersburg (RU)

(73) Assignee: Corning Incorporated, Corning, NY (US)

( * ) Notice: Subject to any disclaimer, the term of this patent is extended or adjusted under 35 U.S.C. 154(b) by 108 days.

(21) Appl. No.: 14/361,121

(22) PCT Filed: Nov. 29, 2012

(86) PCT No.: PCT/US2012/067051
§ 371 (c)(1),
(2) Date: May 28, 2014

(87) PCT Pub. No.: WO2013/088278
PCT Pub. Date: Jun. 6, 2013

(65) Prior Publication Data
US 2014/0367611 A1  Dec. 18, 2014

Related U.S. Application Data

(60) Provisional application No. 61/565,122, filed on Nov. 30, 2011.

(51) Int. Cl.
*B01D 53/02* (2006.01)
*G06F 17/50* (2006.01)
(Continued)

(52) U.S. Cl.
CPC ............ *G06F 17/50* (2013.01); *B01D 53/0407* (2013.01); *B01J 20/18* (2013.01); *B01J 20/28045* (2013.01); *B01D 2253/108* (2013.01);
(Continued)

(58) Field of Classification Search
CPC .................. B01D 2253/108; B01D 2253/342; B01D 2257/504; B01D 53/0407; B01J 20/18; B01J 20/28045; G06F 17/50; Y02C 10/08
See application file for complete search history.

(56) References Cited

U.S. PATENT DOCUMENTS 8,163,069 B2    4/2012  Jiang
8,496,734 B2    7/2013  Gadkaree et al.
(Continued)

FOREIGN PATENT DOCUMENTS

CN    1869686    11/2006
CN    101214151   7/2008
(Continued)

OTHER PUBLICATIONS

Chen et al., Mathmatical modeling of monolith catalyst and reactors for gas phase reactions, Applied Catalysis A: General 345, Apr. 20, 2008, pp. 1-11.
(Continued)

*Primary Examiner* — Christopher P Jones
(74) *Attorney, Agent, or Firm* — Zachary J. Wegmann; Gregory A. Lewis (57) ABSTRACT

A method of determining an optimal geometry for monoliths useful for capturing $CO_2$ is described. Monoliths having the determined desired geometry are also described.

13 Claims, 10 Drawing Sheets

(51) Int. Cl.
 B01D 53/04 (2006.01)
 B01J 20/18 (2006.01)
 B01J 20/28 (2006.01)
(52) U.S. Cl.
 CPC ... B01D 2253/342 (2013.01); B01D 2257/504 (2013.01); Y02C 10/08 (2013.01)

(56) References Cited

U.S. PATENT DOCUMENTS

| | | |
|---|---|---|
| 8,500,880 B2 | 8/2013 | Jiang |
| 8,647,412 B2 | 2/2014 | Jiang et al. |
| 8,728,218 B2 | 5/2014 | Knapp et al. |
| 8,801,834 B2 | 8/2014 | Addiego et al. |
| 8,858,690 B2 | 10/2014 | Halder et al. |
| 8,901,030 B2 | 12/2014 | Knapp et al. |
| 8,974,577 B2 | 3/2015 | Jiang et al. |
| 9,011,583 B2 | 4/2015 | Halder et al. |
| 9,062,586 B2 | 6/2015 | Jiang et al. |
| 9,073,000 B2 | 7/2015 | Halder et al. |
| 2007/0207917 A1 | 9/2007 | Sink et al. |
| 2008/0148936 A1* | 6/2008 | Baksh ............... B01D 53/02 95/47 |
| 2011/0296872 A1* | 12/2011 | Eisenberger ........ B01D 53/04 62/640 |
| 2013/0207034 A1 | 8/2013 | Addiego |
| 2015/0299054 A1 | 10/2015 | Ogunwumi et al. |

FOREIGN PATENT DOCUMENTS

| | | |
|---|---|---|
| WO | 2015054332 | 4/2015 |
| WO | 2015080998 | 6/2015 |

OTHER PUBLICATIONS

Ferrizz et al., Monolithic Supports with unique Geometries and Enhanced Mass Transfer, Sandia Report, Jan. 2004, pp. 1-32, Sandia National Laboratories, Albuquerque, New Mexico.
Rezai et al., Optimum structured adsorbents for gas separation processes, Chemical Engineering Science 64, Sep. 1, 2009, pp. 5182-5191.
International Search Report, dated Feb. 8, 2013, pp. 1-3, International Patent Application No. PCT/US12/67051, US Patent Office, Alexandria, Virginia.
Written Opinion of the international Searching Authority, dated Feb. 8, 2013, pp. 1-3, International Patent Application No. PCT/US12/67051, US Patent Office, Alexandria, Virginia.
CN201280067635.2 First Office Action dated Oct. 26, 2015.
Addiego et al; "Methods for Regenerating a Carbon Dioxide Capture Article"; U.S. Appl. No. 62/166,318, filed May 26, 2015.

* cited by examiner

MONOLITH GEOMETRY DESIGN FOR CARBON DIOXIDE CAPTURE

CROSS-REFERENCE TO RELATED APPLICATIONS

This application claims the benefit of priority under 35 U.S.C. §371 of the International Application Serial No. PCT/US12/67051 filed on Nov. 29, 2012, which claims the benefit of U.S. Provisional Application No. 61/565,122 filed on Nov. 30, 2011, the content of which is relied upon and incorporated herein by reference in its entirety.

FIELD OF THE DISCLOSURE

The present disclosure relates generally to methods for designing monolith articles used in the removal of $CO_2$ from a gas, and in particular analytical models for predicting optimal monolith geometry for flow-through monolith substrates.

SUMMARY

Disclosed herein are methods for designing monolith articles used in the removal of $CO_2$ from a gas.

In a first aspect, a method for determining an optimal monolith geometry for a honeycomb monolith is provided, comprising the steps of: calculating a design index, S, according to the following formula:

$$S = \frac{t_r}{t_f} = \frac{1/K}{L/u} = \frac{u}{KL} = \frac{V}{(OFA)(K)(L)}$$

wherein where $t_r$ is the reaction time-scale, $t_f$ is the flow time-scale, u is the velocity of feed gas inside the channel, K is the reaction rate, L is the length of the reactor, OFA is open frontal area, and V is the velocity of feed gas outside the monolith; determining if S is equal to or less than a desirable value; change one or more monolith parameters to make S equal to or less than the desirable value.

In a second aspect, the method of aspect 1 is provided, wherein the monolith parameter is length L.

In a third aspect, the method of aspect 1 is provided, wherein the monolith parameter is monolith OFA.

In a fourth aspect, the method of aspect 1 is provided, wherein the monolith parameter is u.

In a fifth aspect, the method of aspect 1 is provided, wherein the monolith parameter is monolith porosity, $\phi$.

In a sixth aspect, the method of aspect 1 wherein the monolith parameter is monolith tortuosity, $\tau$.

In a seventh aspect, the method of aspect 1 is provided, wherein the monolith parameter is V.

In an eighth aspect, the method of aspect 1 is provided, wherein the monolith parameter is cells per square inch, CPSI.

In a ninth aspect, the method of aspect 1 is provided, wherein the monolith parameter is wall thickness.

In a tenth aspect, the method of aspect 1 is provided, wherein the desirable value for S is equal to or less than 0.35.

In an eleventh aspect, the method of aspect 1 is provided, wherein the desirable value for S is equal to or less than 0.30.

In a twelfth aspect, the method of aspect 1 is provided, wherein the desirable value for S is equal to or less than 0.25.

In a thirteenth aspect, the method of aspect 1 is provided, wherein the desirable value for S is equal to or less than 0.2.

In a fourteenth aspect, the method of aspect 1 is provided, wherein the desirable value for S is equal to or less than 0.15.

In a fifteenth aspect, the method of aspect 1 is provided, wherein the desirable value for S is equal to or less than 0.1.

In a sixteenth aspect, a monolith for $CO_2$ capture is provided having an S value equal to or less than 0.4, wherein S is defined by the formula:

$$S = \frac{t_r}{t_f} = \frac{1/K}{L/u} = \frac{u}{KL} = \frac{V}{(OFA)(K)(L)}$$

In a seventeenth aspect, the monolith of aspect 16 is provided wherein the S value is equal to or less than 0.35.

In an eighteenth aspect, the monolith of aspect 16 is provided wherein the S value is equal to or less than 0.30.

In a nineteenth aspect, the monolith of aspect 16 is provided wherein the S value is equal to or less than 0.25.

In a twentieth aspect, the monolith of aspect 16 is provided wherein the S value is equal to or less than 0.2.

In a twenty-first aspect, the monolith of aspect 16 is provided wherein the S value is equal to or less than 0.15.

In a twenty-second aspect, the monolith of aspect 16 is provided wherein the S value is equal to or less than 0.1.

The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION $CO_2$ capture is traditionally performed using packed-bed reactors. However, increasing demand for faster cycle times (e.g., faster adsorption followed by desorption) and low back-pressure in performing $CO_2$ capture introduces the opportunity to use different types of reactors. Honeycomb monoliths are an alternative type of reactor for use in a $CO_2$ capture process. In order to determine whether a monolith is practical in a $CO_2$ capture process, a critical question is whether a monolith can provide enough surface area and sorbent required to match or exceed packed-bed performance. Increasing surface area in a monolith generally requires an increase in the cell density of a monolith (described as "cells per square inch" or "CPSI"). However, increasing the cell density of a monolith usually results in an increase in back-pressure through the monolith. Therefore, a model is needed to analyze and predict the optimal design of the geometry of an extruded honeycomb monolith to achieve high performance in $CO_2$ capture, while maintaining low backpressure and low manufacturing cost.

For the purposes of this disclosure, abbreviations are shown in Table 1.

TABLE 1

| Name | Symbols | Units | Value |
|---|---|---|---|
| Overall adsorption rate | K | 1/s | |
| Overall mass transfer coefficient | k | m/s | |
| Surface area per unit bed volume | a | 1/m | |
| Film mass transfer coefficient (inside the channel, without a wall component) | $k_f$ | m/s | |
| Pore mass transfer coefficient (inside the wall, without a channel component - from the surface of the wall to the center of the wall) | $k_p$ | m/s | |
| Open frontal area (OFA) | $\epsilon_b$ | | |
| Molecular diffusivity of gas | $D_m$ | m²/s | $2.6 \times 10^{-5}$ m²/s |
| Sorbent porosity | φ | | 0 to 1 |
| Sorbent tortoisity | τ | | 1 to 10 |
| Gas density | ρ | kg/m³ | 1.2 |
| Viscosity of gas | μ | Pa-s | $1.8 \times 10^{-5}$ |
| Reynolds number | Re | | |
| Schmidt number | Sc | | |
| Cell density | CPSI | Cells per square inch | |
| reaction time-scale | $t_r$ | | |
| flow time-scale | $t_f$ | | |
| velocity of feed gas inside the channel | u | m/s | |
| length of the monolith | L | | |
| Open Frontal Area | OFA | | |
| Design Index | S | | |
| Velocity of feed gas outside the monolith | V | m/s | |
| Mass Transfer Zone | mtz | | |

"Monolith" means an extruded honeycomb structure having a plurality of parallel, gas conducting cells defined by cell walls, extending from one end-face to another end face.

In an embodiment of an analytical model for predicting optimal monolith geometry for flow-through monolith substrates, the model predicts geometric design of a monolith vs. $CO_2$ capture performance. In embodiments, the predicted design vs. $CO_2$ capture performance is applicable to, but not limited to, various zeolite compositions. The model predicts that that for a fixed amount of sorbent, one gets diminishing returns for increasing CPSI beyond a certain critical point, and that there is an optimal CPSI which can give good performance while also balancing the need for low back-pressure and cost. It thereby provides parameters for the design of monoliths for $CO_2$ capture (balancing optimal geometry, sorbent content, and minimum back-pressure).

The $CO_2$ adsorption and desorption process in a monolith exhibits the following independent limiting characteristics: (1) Reaction rate of $CO_2$ gas with sorbent (K) which includes diffusion into layers of sorbent such that the entire sorbent layer participates in the adsorption/desorption process, sticking (and bond formation) of $CO_2$ with the sorbent layer in adsorption, and vice versa in case of desorption; and (2) flow rate time scale ($t_f$) which describes how quickly the $CO_2$ adsorbed from the feed is replenished.

Under various processing conditions, one or both of the above-listed phenomena may be the dominating or controlling, or the limiting factor, in the adsorption/desorption process. For example, if the flow rate is extremely fast, then adsorbed $CO_2$ is replenished in the monolith almost instantly, and therefore flow rate of feed does not control the adsorption/desorption process anymore. Or, for example, if the time required for $CO_2$ to adsorb or desorb (the reaction rate) from the sorbent is extremely fast, the reaction rate is not a limiting factor. To estimate under what conditions the above phenomena are dominating, time-scale analysis was performed. In this analysis, time-scales of each of the phenomena were estimated and compared.

In embodiments, a Design Index is provided to predict a honeycomb monolith suitable for use in $CO_2$ capture applications. This index can be used to understand the dominating phenomenon in a $CO_2$ capture application, and design a monolith to optimize the geometry of the monolith to optimize the efficiency of a $CO_2$ capture application. Using embodiments of the Design Index, one can predict optimal CPSI at various Open Frontal Areas (OFA) of monoliths for $CO_2$ adsorption applications. In embodiments, this index may also serve as a scale-up predictor for moving from laboratory scale to field conditions for $CO_2$ adsorption applications. For example, a value (S) for the Design Index may be calculated. If the Design Index is less than a threshold value, then changes in the geometry of the monolith will affect the efficiency of the $CO_2$ adsorption reaction.

Using embodiments of the Design Index for selecting an optimal geometry of a honeycomb monolith for $CO_2$ capture application can provide several advantages. For example, by using the Design Index the $CO_2$, capture performance (amount of $CO_2$ adsorbed per time) will be optimized. The high performance will be obtained while keeping the adsorbent loading low, therefore allowing for manufacture of monoliths at lower cost. The high performance will be obtained while keeping the backpressure low, therefore make this more attractive for application to the customer. Use of the Design Index is applicable for a broad number of extruded monolithic substrates and sorbent materials which are limited in performance by pore diffusion limitations. In addition, embodiments of the Design Index allow manufacturers to design monoliths with high sorbent utilization in the walls of the monolith.

The Design Index, S, is shown in Formula 1:

$$S = \frac{t_r}{t_f} = \frac{1/K}{L/u} = \frac{u}{KL} = \frac{V}{(OFA)(K)(L)} \quad (1)$$

where $t_r$ is the reaction time-scale and $t_f$ is the flow time-scale, u is the velocity of feed gas inside the channel, K is the reaction rate, u is the velocity of feed gas inside the monolith, V is the velocity of feed gas outside the monolith, L is the length of the reactor and OFA is Open Frontal Area, the percentage of the end face of a monolith which is open for gas flow. The flow time-scale $t_f$ is calculated as the time spent by a feed gas inside a reactor, given by length of the reactor divided by the velocity in the channel. The reciprocal of flow time-scale is also called the spatial velocity. The reaction rate, K, is calculated using the mathematical relationship for monoliths reported in Rezaei and Webley (Rezaei and Webley, 2009, *Optimum structured adsorbents for gas separation processes*, Chemical Engineering Science, 64(24): 5182-5191.) The reaction rate, K, is a function of the geometry of the monolith and the material properties and sorbent properties of the monolith. Sorbent properties are, for example, sorbent tortuosity and sorbent porosity. These sorbent properties define K, as shown in Table 2.

The reaction rate, K, can be calculated using the mathematical relationship for monoliths reported in Rezaei and Webley (2009), shown in Table 2:

TABLE 2

| Main equations* | Accessory equations* |
|---|---|
| $K = ka = \dfrac{k_f k_p}{k_f + k_p} \dfrac{2\varepsilon_b}{R_1}$ | $\varepsilon_b = \left[\dfrac{2R_1}{R_1 + R_2}\right]^2$ |
| $k_p = \dfrac{4D_e R_1}{R_2^2 - R_1^2}$ | $D_e = D_m \dfrac{\varphi}{\tau}$ |
| $k_f = 2.95\left[1 + 0.139\left(\dfrac{2R_1}{L}\right)ReSc\right]^{0.81} \dfrac{D_m}{2R_1}$ | $Re = \dfrac{\rho(u)(2R_1)}{\mu}$ |
| | $Sc = \dfrac{\mu}{\rho D_m}$ |
| $CPSI = \left[\dfrac{0.0254}{R_1 + R_2}\right]^2$ | |

*from Razaei and Webley, 2009)

Figure 1:
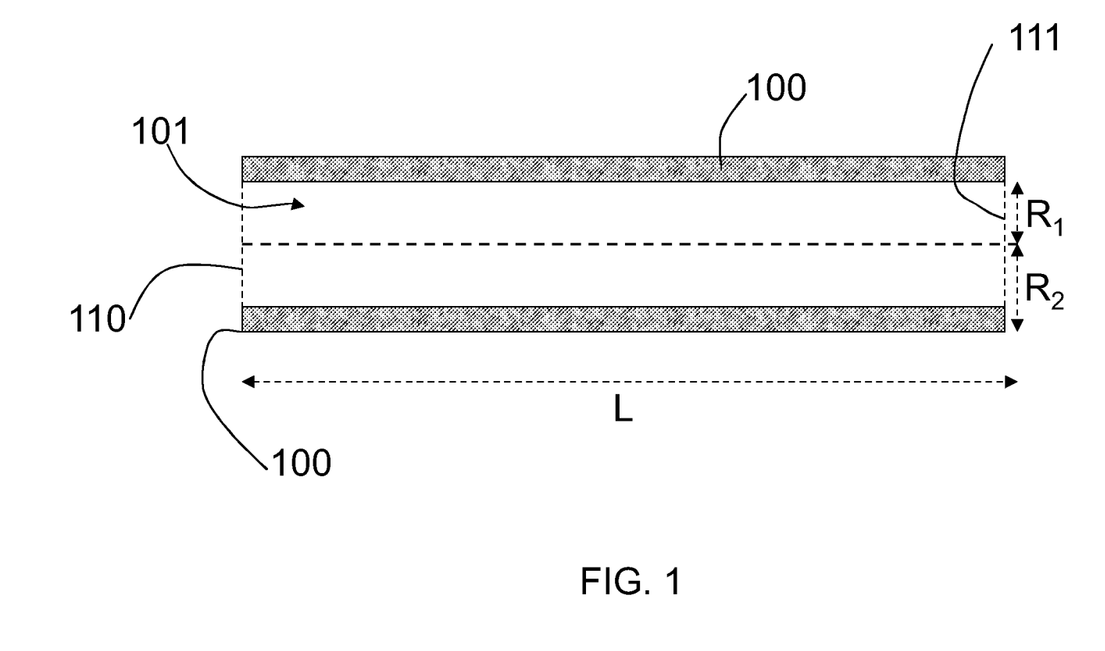
FIG. 1 is a schematic drawing of a cross-section of a channel of a monolith.

FIG. 1 is a schematic drawing of a cross-section of a channel of a monolith. FIG. 1 shows walls 100 forming a channel 101 extending along a length L from one end face 110 to a second end face 111 of a monolith. FIG. 1 illustrates $R_1$ and $R_2$. $R_1$ and $R_2$ are length dimensions. $R_1$ is a channel radius. $R_2$ is a channel radius plus the thickness of a channel wall. $R_1$ represents flow in a channel. $R_2$ represents flow in a channel, plus flow in a channel wall (see FIG. 1). K, the reaction coefficient, is calculated based on $k_f$, the film mass transfer coefficient, which is the transfer coefficient inside the channel, without a wall component, and $k_p$, the pore mass transfer coefficient, which is the transfer coefficient inside the wall, without a channel component (from the surface of the wall to the center of the wall). In the Razaei and Webley publication, validation of the mathematical model is also shown.

Referring to Formula 1, when the reaction time scale ($t_r$) is very small, S<<1, the reaction occurs very quickly. If S<<1, then reaction time-scale is much smaller than the flow-rate time scale. Therefore, when S<<1, the reaction time-scale is not dominating (or limiting) in the overall $CO_2$ adsorption/desorption process. Instead, when S<<1, flow rate is the dominating phenomenon. The flow time-scale is the time spent by a feed gas inside the reactor, defined by length of the reactor divided by the velocity of the gas in the channel.

If S<<1, adsorption or bond formation of $CO_2$ with the adsorbent bed occurs rapidly (~10-6 seconds). This is extremely fast compared with other diffusion and flow time-scales, therefore is not a dominating factor in the overall adsorption process. In other words, it means that $CO_2$ molecules bind to the surface as soon as they reach any open site; therefore there is always local equilibrium near the surface.

The effective mass transfer zone (henceforth referred as mtz) can be calculated as distance traveled by the feed within reaction time-scale, shown in Formula 2:

$$mtz = u \times t_r = \frac{u}{K} \quad (2)$$

Within a mass transfer zone, if the reaction time is fast, then as soon as $CO_2$ gas comes into the zone, it is adsorbed by the sorbent. This continues until the zone is saturated.

The time required to saturate a mass transfer zone is shown in Formula 3:

$$t_{sat-mtz} = \quad (3)$$
$$\frac{Capacity}{flow\_rate} = \frac{C \times m_s \times (A \times mtz) \times (1 - \phi)}{\rho_{CO2} \dfrac{P_{CO2}}{P_{tot}}(A \times u) \times \phi} = \frac{C \times m_s \times (1 - \phi)}{\left(\dfrac{P_{CO2} M_{CO2}}{RT}\right) \times \phi \times K}$$

If length of the reactor is larger than the mass transfer zone, then the breakthrough time can be calculated as the time to saturate the whole reactor, given by Formula 4:

$$t_{break} = \quad (4)$$
$$t_{sat-mtz} \times \frac{L}{mtz} = \frac{C \times m_s \times (1 - \phi)}{\left(\dfrac{P_{CO2} M_{CO2}}{RT}\right) \times \phi \times K} \times \frac{L}{\left(\dfrac{u}{k}\right)} = \frac{C \times m_s \times (1 - \phi)}{\left(\dfrac{P_{CO2} M_{CO2}}{RT}\right) \times \phi} \times \frac{L}{u}$$

Therefore, it can be seen that, when S<<1, the breakthrough time is independent of reaction rate. Instead, the breakthrough time depends on the Capacity of the bed (C), sorbent density (ms in kg/m$^3$), velocity of the feed and length of the reactor. When S<<1, that reaction time-scale is small (that is, the reaction occurs rapidly) and therefore, the reaction is not dominating (or limiting) in the overall adsorption/desorption process.

When S>>1, the reaction time is slow, and the reaction time is the limiting factor or the dominating phenomenon in the overall $CO_2$ adsorption/desorption process. In this case, the flow rate is fast and the reaction rate is slow. When the reaction rate is slow, a reactor will become saturated. Or, the length of the reactor is smaller than the mass transfer zone. Therefore, when S>>1, the breakthrough time is the time to saturate the mass transfer zone. Therefore, when S>>1, the breakthrough time is dependent on reaction rate and capacity of the bed (C) and sorbent density ($m_s$). And, when S>>1, the breakthrough time is independent of the velocity of the feed and the length of the reactor. When S>>1, the rate of reaction will not be affected by changing the geometry of a monolith.

When S=1, reaction time and flow time are comparable, and both the reaction rate and the flow rate must be considered in calculating an appropriate monolith geometry for $CO_2$ adsorption and desorption.

Figure 2:
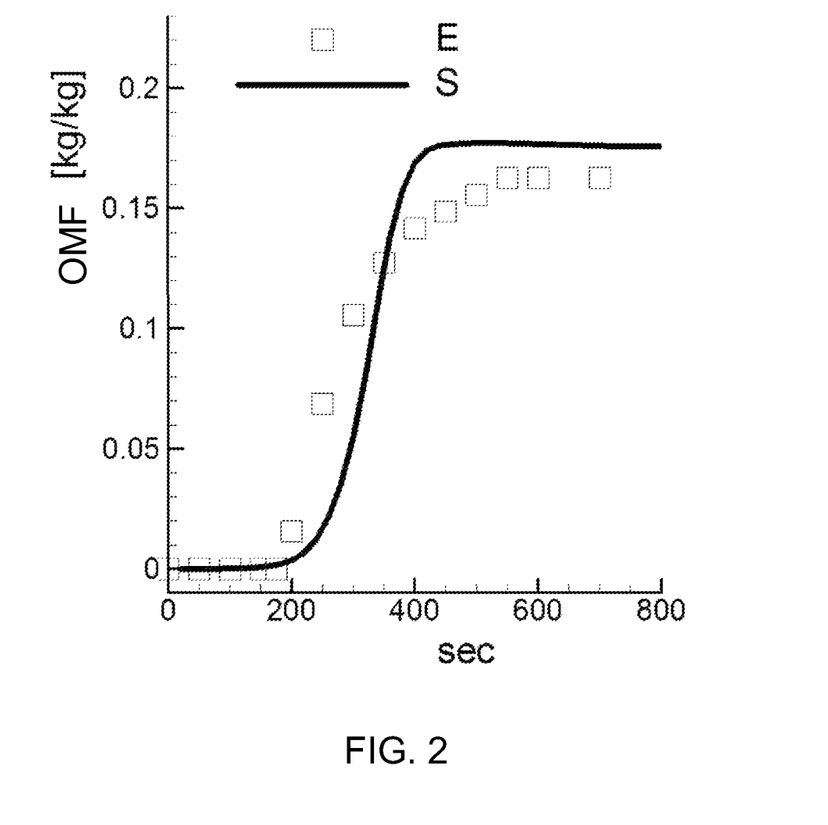
FIG. 2 is a graph showing the outlet $CO_2$ mole fraction as calculated using an embodiment of a packed bed model compared to experimental results of a packed bed.

To validate the assumptions, values were calculated based on a comprehensive model provided in Jun Zhang, Paul A. Webley, Penny Xiao, 2008, *Effect of process parameters on power requirements of vacuum swing adsorption technology for CO2 capture from flue gas*, Energy Conversion and Management, 49: 346-356 (Zhang et al., 2008). These calculated values were compared with experimental measurements taken from a packed-bed system having the following characteristics: flow-rate=66 liters per minute; sorbent is Zeolite 13X; bed porosity=0.35; length of bed=1 meter, as reported in The results of this validation comparison are shown in FIG. 2. As shown in FIG. 2, the calculated curve closely follows experimental results in a packed-bed environment.

Figure 3:
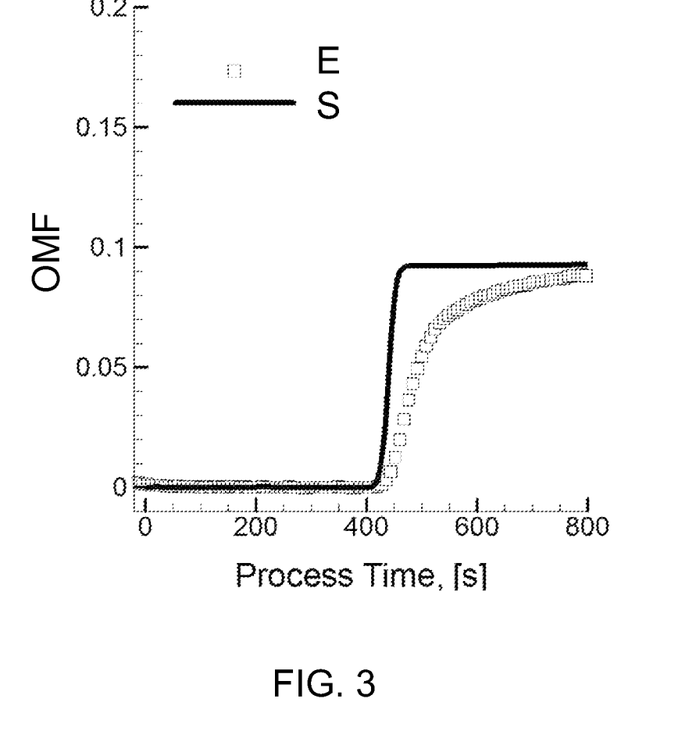
FIG. 3 is a graph showing the outlet $CO_2$ mole fraction as calculated using an embodiment of a monolith model compared to experimental results of a monolith.

Validation was also performed comparing values calculated based on the comprehensive model provided in (Zhang et al., 2008) to a monolith system for $CO_2$ capture having the following characteristics: flow-rate=0.5 liters per minute; sorbent is Zeolite 13X; geometry=222/15.6; Length=7.5 cm. The squares show a curve formed from experimental results taken from the experimental monolith. The model predicts the breakthrough time (when the $CO_2$ mole fraction starts to rise above zero) very closely with the experimental data. The prediction is poor after the breakthrough time (after 450 seconds). As shown in FIG. 3, the calculated curve closely follows experimental results in a monolith environment. The model was used to predict the breakthrough time; therefore the use of model is justified.

Figure 4:
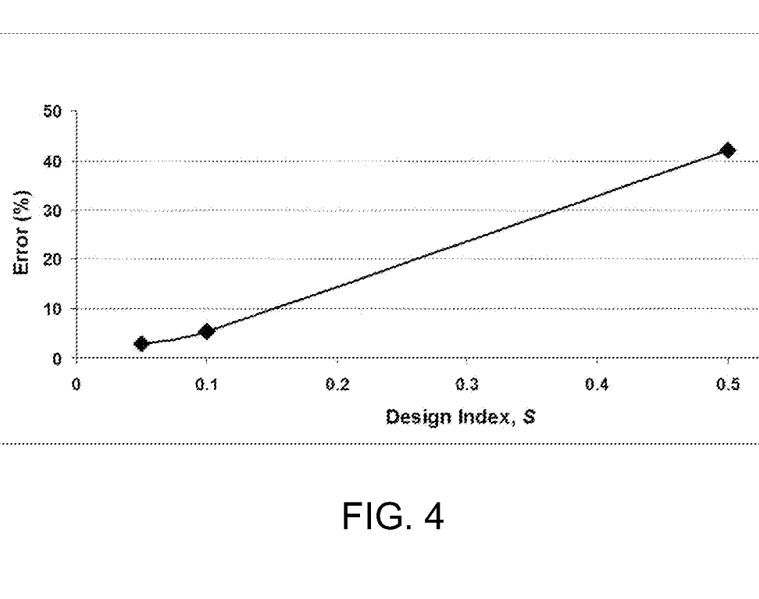
FIG. 4 is a graph plotting error (%) against design index, S, showing the error between Comprehensive and Analytical model predictions.

A comprehensive model, which includes both reaction and flow, was solved for various input conditions to estimate the value of S when reaction is not dominating (or limiting). This is done by comparing the breakthrough time obtained by the comprehensive model (Zhang et al., 2008) with an analytical model (Equation. 4). Therefore, when reaction is not dominating, the analytical model should match closely with the comprehensive model. The error between the comprehensive model and the analytical model is close to 0% when reaction is not dominating. To estimate the value of S when reaction is not dominating, the error between analytical and comprehensive is plotted against S. FIG. 4 is a graph plotting error (%) against design index, S, showing the error between Comprehensive and Analytical model predictions. As can be seen in FIG. 4, when S is 0.1, the error between the comprehensive model and analytical model is less than 5%, showing that the reaction is not playing a major role. In other words, when S is less than 0.1, the error is less than 5% showing that reaction is not dominating and has a small effect on performance.

In embodiments, the present disclosure provides a method for determining an optimal monolith geometry for a honeycomb monolith is provided, comprising the steps of: calculating a design index, S, according to the following formula:

$$S = \frac{t_r}{t_f} = \frac{1/K}{L/u} = \frac{u}{KL} = \frac{V}{(OFA)(K)(L)}$$

wherein where $t_r$ is the reaction time-scale, $t_f$ is the flow time-scale, u is the velocity of feed gas inside the channel, K is the reaction rate, L is the length of the reactor, OFA is open frontal area, and V is the velocity of feed gas outside the monolith; determining if S is equal to or less than a desirable value, such as, for example if S≤0.1, change monolith geometrical parameters to make S equal to or less than a desirable value, for example 0.1.

Figure 5:
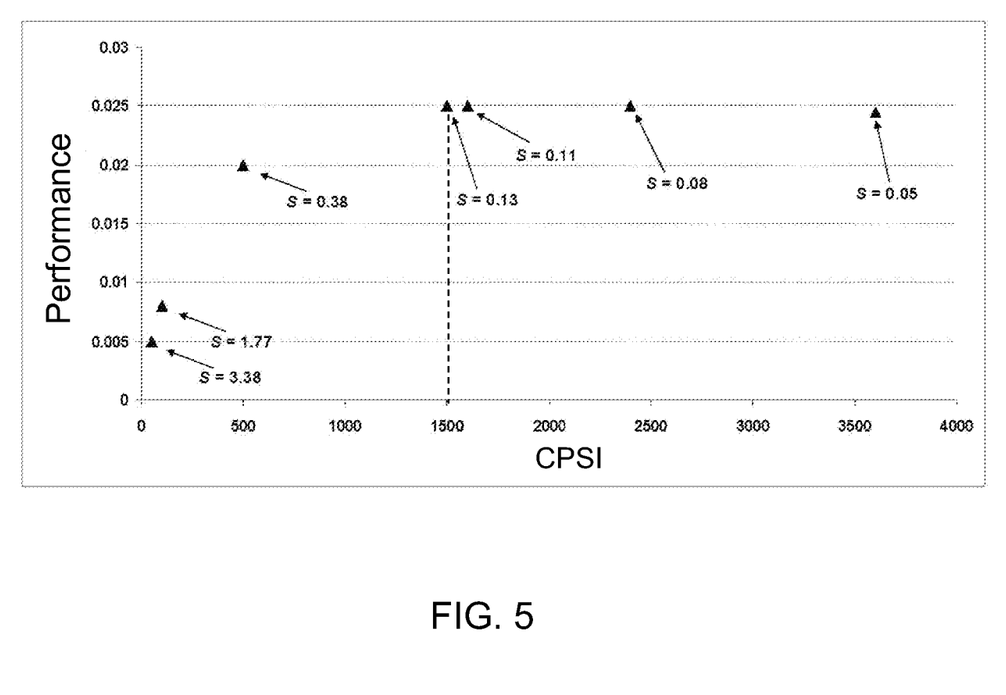
FIG. 5 is a graph plotting performance (calculated as the reciprocal of time to saturate the bed) with cell density (per square inch or CPSI), indicating the optimum CPSI, according to a model.

FIG. 5 is a graph plotting performance (calculated as the reciprocal of time to saturate the bed) with cell density (per square inch or CPSI), indicating the optimum CPSI, according to a model. The performance during the adsorption step is represented as the reciprocal of time required to saturate a bed of various cell densities (but constant Open Frontal Area of 0.6). It was observed that, in the tested system (Flow rate=150 MMSCFD, and Pressure=20 bar. The bed is 0.3 meters in diameter and 1 meters in length. Adsorbent is Zeolite 13X extruded as monolith), the performance saturates after an optimum CPSI is reached (Optimum CPSI is 1500 for the case shown here). This Optimum CPSI is when S=0.1 or reaction transitions from being dominating to being just non-dominating.

Figure 6:
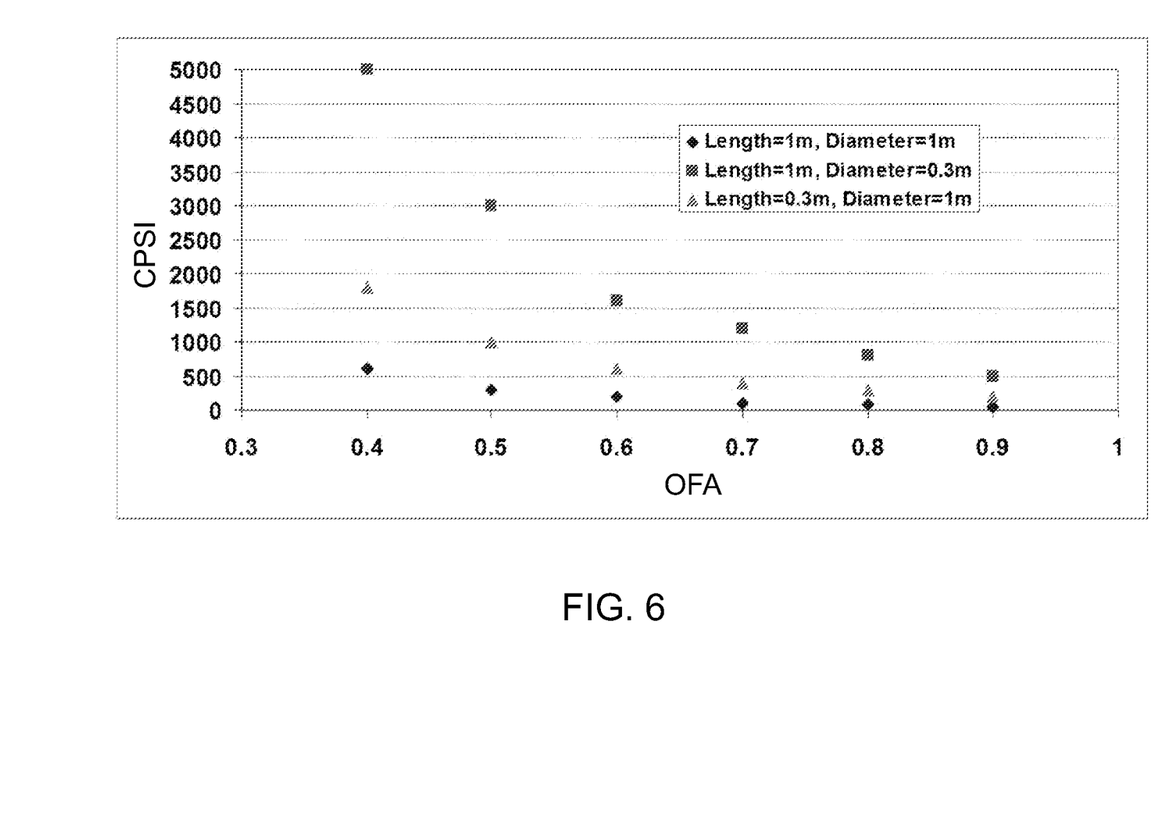
FIG. 6 is a graph plotting the optimal cell density (CPSI) against the open frontal area of a monolith, showing the optimal cell density for various reactor sizes.

FIG. 6 is a graph plotting the optimal cell density (CPSI) against the open frontal area of a monolith, showing the optimal cell density for various reactor sizes. The optimum cell density for various reactor sizes are shown. As the length and diameter decreases, the optimum cell density increases due to increase in velocity inside the monolith, (u or V/OFA). The effect of diameter on optimum cell density is more than length. The operating conditions are: Flow rate=150 MMSCFD, and Pressure=20 bar. Adsorbent is Zeolite 13X (extruded as monolith). If S<<1, then the breakthrough time is not a function of reaction rate. It is a function of velocity of the feed, capacity of the adsorbent and amount of adsorbent (OFA and length of the reactor). Therefore, there should be no performance increase or shift in breakthrough curve, if the CPSI is increased (thereby increasing surface area) keeping all other variables same (as shown in FIG. 5). As shown in FIG. 6, for every OFA, there is an optimum CPSI, beyond which reaction is fast and hence non-dominating. Any further increase in reaction rate by increasing the CPSI (keeping OFA same) is unnecessary because reaction is not dominating.

Figure 7:
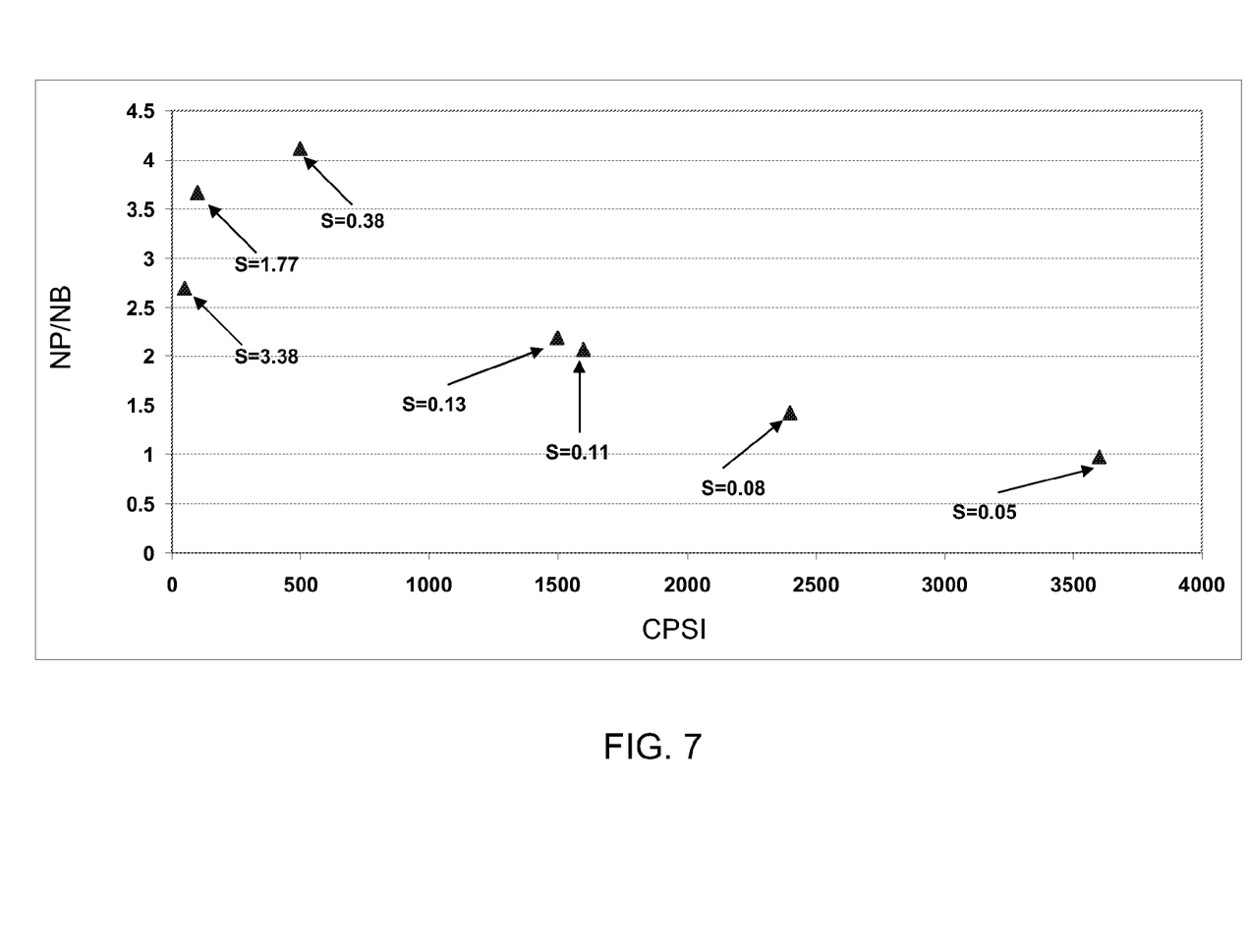
FIG. 7 is a graph showing normalized performance/normalized backpressure vs CPSI.
Figure 8:
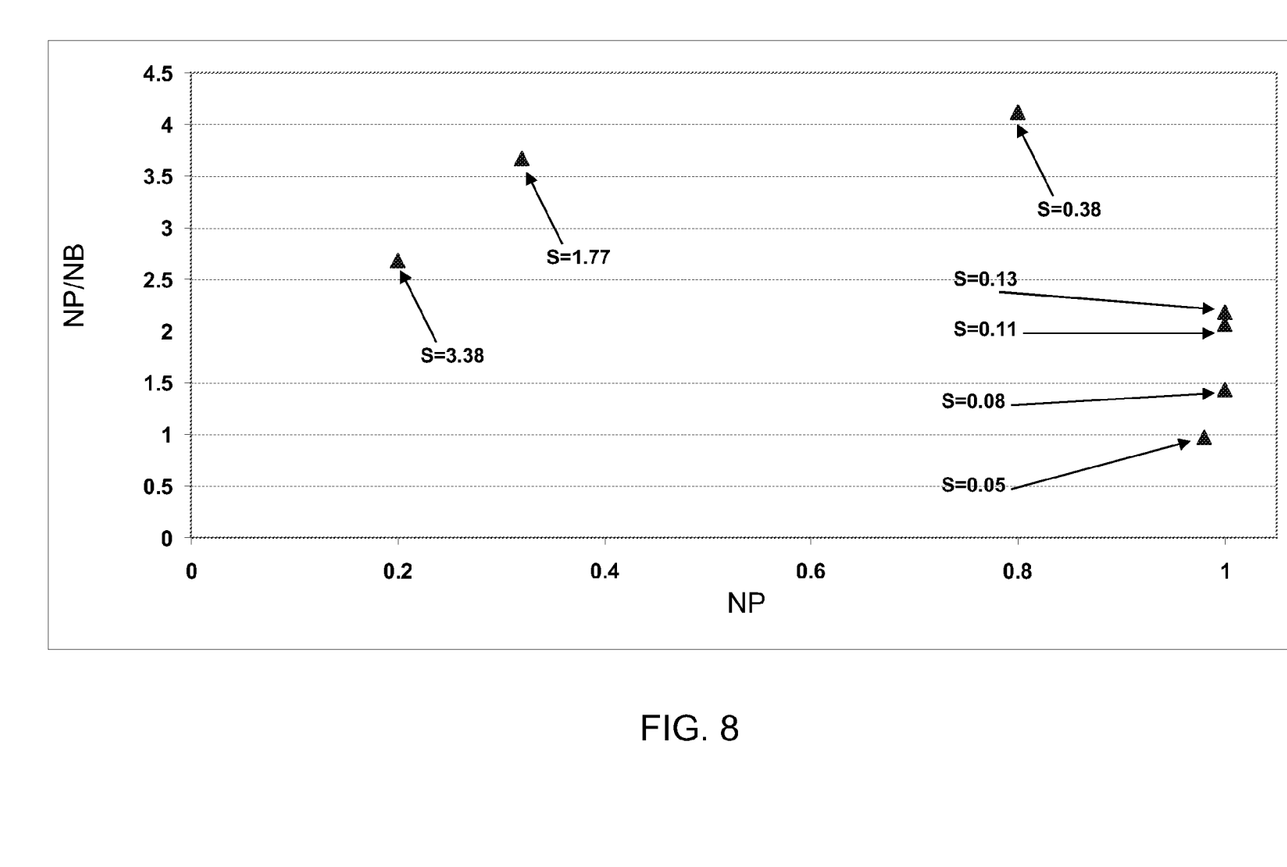
FIG. 8 is a graph showing normalized performance/normalized backpressure vs normalized performance.
Figure 9:
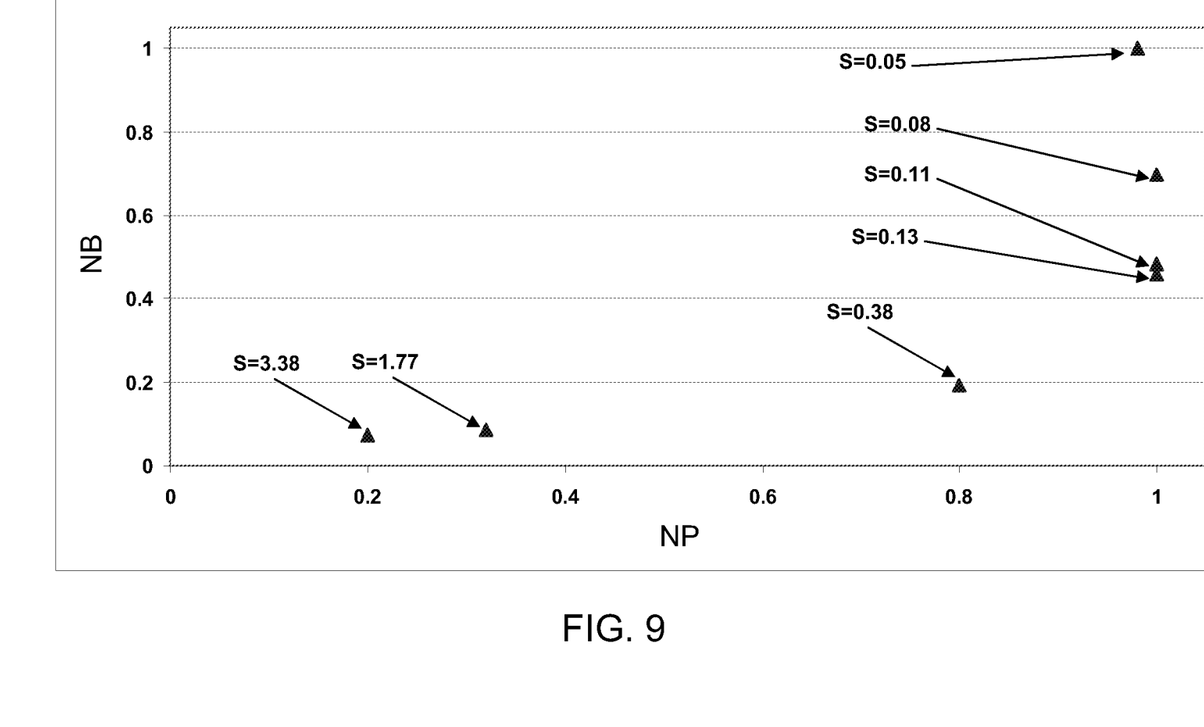
FIG. 9 is a graph illustrating normalized backpressure vs. normalized performance.

For FIGS. 7-9, performance and backpressure have been normalized. The calculated value of performance and backpressure at 3600 cell density (which has reached optimal performance, as shown in FIG. 5) and divided that number with rest of the performance and backpressure values at various cell densities. Therefore, the normalized performance and normalized backpressure lies between 0 and 1, with 1 being at the 3600 cell density.

FIG. 7 is a graph showing normalized performance/normalized backpressure vs CPSI. For optimal performance, a higher number for performance and low number for backpressure is desirable. Therefore, a high value on the y-axis of the graph shown in FIG. 7 is desirable. Here we observe that 500 cell-density gives the highest value. This gives a picture of optimization when two variables, adsorption kinetics and backpressure, are important.

FIG. 8 is a graph showing normalized performance/normalized backpressure vs normalized performance. Here, optimal performance is in the right upper corner, indicating high performance and low back-pressure. Again we see that S=0.4 (at around cell density 500) gives the best value.

FIG. 9 is a graph illustrating normalized backpressure vs. normalized performance. Here, optimal performance resides in the right lower corner, indicating high performance and low back-pressure. Again we see that S=0.4 (at around cell density 500) gives the best value. Beyond performance of 0.8, the backpressure increases with a very steep slope (meaning increase in backpressure is significant compared to increase in performance.

Depending upon the desired application, a very high performance at the cost of backpressure or low backpressure at reasonable performance may be desirable. As shown in FIGS. 7-9, performance of 0.8 (corresponding to S=0.4) includes most of the backpressure sensitive to high performance applications.

Figure 10:
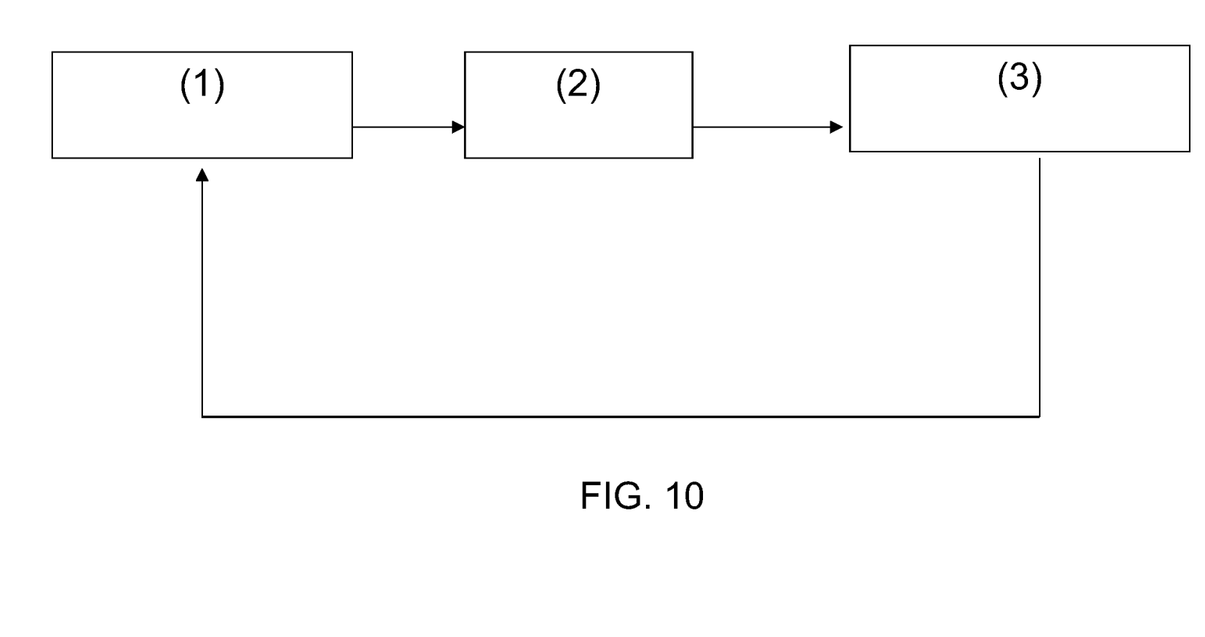
FIG. 10 is a flow chart showing an embodiment of the disclosed method.

Using these understandings, it is possible to predict the optimal geometry of monoliths for use in $CO_2$ separation applications. FIG. 10 is a flow chart showing an embodiment of the disclosed method. According to Equation (1), for a given monolith size and length, flow rate, OFA, CPSI, and reaction rate, it is possible to characterize and calculate a Design Index, "S". Step (1) of the flow chart shown in FIG. 10 illustrates calculating S. Taking into account the parameters discussed above, and shown in 5 and FIGS. 7-9, an S of less than or equal to 0.4 is desirable, in embodiments. In additional embodiments, an S of less than 0.35, less than or equal to 0.3, less than or equal to 0.25, less than or equal to 0.2, less than or equal to 0.15, less than or equal to 0.1, less than or equal to 0.05 or less than or equal to 0.01 are also desirable. In step (2), as shown in FIG. 10, a determination can be made of whether S is at a desirable value or less. In step (3) as shown in FIG. 10, if S is greater than the desired value for S, monolith characteristics can be changed to bring S to the desired value.

For example, if a calculated S value for a proposed monolith structure is if the calculated S value is larger than 0.4, in an embodiment, the monolith parameters may be changed to reduce S. Monolith parameters include geometric parameters including OFV, CPSI and length of the monolith. Monolith parameters also include system parameters such as gas velocity inside the monolith, gas velocity outside the monolith. Monolith parameters that affect overall adsorption rate (K) such wall thickness and channel size can also be changed.

As shown in FIG. 4, a monolith having an S value less than or equal to 0.1 is desirable because when the S value is less than or equal to 0.1, the flow time scale and not the reaction time scale is dominating. Monoliths having a range of S values from 0.1 to 0.4 are desirable. In embodiments, monoliths having S values less than or equal to 0.4, less than or equal to 0.35, less or equal to than 0.3, less or equal to than 0.25, less than or equal to 0.2, less than or equal to 0.15, less than or equal to 0.1, less than or equal to 0.05 or less than or equal to 0.01 are disclosed.

In embodiments, the present disclosure provides a method for determining an optimal monolith geometry for a honeycomb monolith is provided, comprising the steps of: calculating a design index, S, according to the following formula:

$$S = \frac{t_r}{t_f} = \frac{1/K}{L/u} = \frac{u}{KL} = \frac{V}{(OFA)(K)(L)}$$

wherein where $t_r$ is the reaction time-scale, $t_f$ is the flow time-scale, u is the velocity of feed gas inside the channel, K is the reaction rate, L is the length of the reactor, OFA is open frontal area, and V is the velocity of feed gas outside the monolith; determining if S is equal to or less than a desirable value, change monolith geometrical parameters to make S equal to or less than a desirable value. The desirable value of S may be, for example, 0.4, 0.35, 0.3, 0.25, 0.2, 0.15, 0.1, 0.05, or 0.01.

In additional embodiments, the present disclosure provides a monolith for $CO_2$ capture or separation having an S value equal to or less than 0.4, wherein S is defined by the formula:

$$S = \frac{t_r}{t_f} = \frac{1/K}{L/u} = \frac{u}{KL} = \frac{V}{(OFA)(K)(L)}$$

In embodiments, the S value may be equal to or less than 0.35, equal to or less than 0.30, equal to or less than 0.25, is equal to or less than 0.2, equal to or less than 0.15, equal to or less than 0.1, equal to or less than 0.05 or equal to or less than 0.01.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for determining an optimal monolith geometry for a honeycomb monolith comprising the steps of:
    a. calculating a design index, S, for the monolith according to the following formula:

$$S = \frac{t_r}{t_f} = \frac{1/K}{L/u} = \frac{u}{KL} = \frac{V}{(OFA)(K)(L)}$$

wherein $t_r$ is the reaction time-scale for $CO_2$ capture, $t_f$ is the flow time-scale for $CO_2$ capture, u is the velocity of feed gas inside the channel, K is the reaction rate for $CO_2$ capture, L is the length of the monolith, OFA is the open frontal area of the monolith, and V is the velocity of feed gas outside the monolith, wherein the monolith comprises a sorbent having a zeolite composition;
    b. determining if S is equal to or less than 0.4 and greater than or equal to 0.01;
    c. changing one or more monolith parameters to make S equal to or less than 0.4 and greater than or equal to 0.01 such that the monolith is characterized by the length, L, being from about 0.3 m to 1 m, the diameter, D, being from about 0.3 m to about 1 m, the open frontal area, OFA, being from 0.4 to 0.9, and a cell density, CPSI, from at least 500 cells per square inch to 5000 cells per square inch.

2. The method of claim 1 wherein the one or more monolith parameters is the length of the monolith, L.

3. The method of claim 1 wherein the one or more monolith parameters is the open frontal area of the monolith, OFA.

4. The method of claim 1 wherein the one or more monolith parameters is the cell density, CPSI.

5. A monolith for $CO_2$ capture,
    wherein the monolith is characterized by a design index, S, equal to or less than 0.13 and greater than or equal to 0.05, wherein S is defined by the formula:

$$S = \frac{t_r}{t_f} = \frac{1/K}{L/u} = \frac{u}{KL} = \frac{V}{(OFA)(K)(L)}$$

wherein $t_r$ is a reaction time-scale for $CO_2$ capture, $t_f$ is a flow time-scale for $CO_2$ capture, u is the velocity of feed gas inside a channel of the monolith, K is a reaction rate for $CO_2$ capture, L is the length of the monolith, OFA is the open frontal area of the monolith, and V is the velocity of feed gas outside the monolith, wherein the monolith comprises a sorbent having a zeolite composition, and further wherein the monolith is characterized by the length, L, from about 7.5 cm to 1 m, the open frontal area, OFA, of about 0.6, and a cell density, CPSI, of at least 1500 cells per square inch.

6. The monolith of claim 5, wherein the monolith is further characterized by a cell density, CPSI, from at least 1500 cells per square inch to about 3600 cells per square inch.

7. The monolith of claim 6, wherein the monolith is further characterized by a length, L, of about 7.5 cm.

8. The monolith of claim 5, wherein the monolith is further characterized by a cell density, CPSI, from at least 1500 cells per square inch to about 2400 cells per square inch.

9. A monolith for $CO_2$ capture, wherein the monolith is characterized by a design index, S, equal to or less than 0.4 and greater than or equal to 0.01, wherein S is defined by the formula:

$$S = \frac{t_r}{t_f} = \frac{1/K}{L/u} = \frac{u}{KL} = \frac{V}{(OFA)(K)(L)}$$

wherein $t_r$ is a reaction time-scale for $CO_2$ capture, $t_f$ is a flow time-scale for $CO_2$ capture, u is the velocity of feed gas inside a channel of the monolith, K is a reaction rate for $CO_2$ capture, L is the length of the monolith, OFA is the open frontal area of the monolith, and V is the velocity of feed gas outside the monolith, wherein the monolith comprises a sorbent having a zeolite composition, and further wherein the monolith is characterized by a length, L, from about 0.3 m to 1 m, a diameter, D, from about 0.3 m to about 1 m, an open frontal area, OFA, from 0.4 to 0.9, and a cell density, CPSI, from at least 500 cells per square inch to 5000 cells per square inch.

10. The monolith of claim 9, wherein the length, L, is equal to about 1 m and the diameter, D, is equal to about 0.3 m.

11. The monolith of claim 9, wherein length, L, is equal to about 0.3 m, the diameter, D, is equal to about 1 m, and the cell density, CPSI, is from at least 1000 cells per square inch to 5000 cells per square inch.

12. The monolith of claim 9, wherein the open frontal area, OFA, ranges from 0.4 to 0.6.

13. The monolith of claim 9, wherein the open frontal area, OFA, ranges from 0.4 to 0.7, and the cell density, CPSI, is from 1000 cells per square inch to about 5000 cells per square inch.

* * * * *